(12) United States Patent
Hu et al.

(10) Patent No.: US 11,659,671 B2
(45) Date of Patent: May 23, 2023

(54) BUCKLE ASSEMBLY AND ELECTRONIC DEVICE USING THE SAME

(71) Applicant: PEGATRON CORPORATION, Taipei (TW)

(72) Inventors: Geng-Siang Hu, Taipei (TW); Wei-Lung Lin, Taipei (TW); Ting-Hao Yang, Taipei (TW); Chen-Yun Hsieh, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 334 days.

(21) Appl. No.: 17/164,307

(22) Filed: Feb. 1, 2021

(65) Prior Publication Data
US 2021/0282283 A1 Sep. 9, 2021

(30) Foreign Application Priority Data
Mar. 3, 2020 (TW) .................................. 109106892

(51) Int. Cl.
*F16B 39/10* (2006.01)
*H05K 5/02* (2006.01)
*F16B 41/00* (2006.01)
*H05K 5/00* (2006.01)

(52) U.S. Cl.
CPC .......... *H05K 5/0221* (2013.01); *F16B 41/002* (2013.01); *H05K 5/0008* (2013.01)

(58) Field of Classification Search
CPC ........ F16B 39/10; F16B 41/00; F16B 41/002; H05K 5/0221

USPC .... 411/81, 116, 136, 992, 995, 999; 70/187, 70/229, 231; 292/5, 8, 11, 57, DIG. 41
See application file for complete search history.

(56) References Cited

U.S. PATENT DOCUMENTS

| | | | | |
|---|---|---|---|---|
| 6,644,075 | B2 * | 11/2003 | Thompson | F16L 23/003 411/372.5 |
| 7,591,246 | B2 * | 9/2009 | Beardmore | F02M 55/04 123/456 |
| 9,894,796 | B1 * | 2/2018 | Christenson | H05K 7/1489 |
| 10,668,878 | B1 * | 6/2020 | Sampson | B60R 16/08 |
| 2008/0129048 | A1 * | 6/2008 | Nagle | F16L 21/065 285/412 |

(Continued)

FOREIGN PATENT DOCUMENTS

| | | |
|---|---|---|
| CN | 2580601 | 10/2003 |
| JP | H0452683 | 5/1992 |
| JP | 2011002089 | 1/2011 |

*Primary Examiner* — Gary W Estremsky
(74) *Attorney, Agent, or Firm* — J.C. Patents

(57) ABSTRACT

A buckle assembly and an electronic device using the buckle assembly are provided. The buckle assembly is assembled in a housing of the electronic device. The housing has an inner surface and a column with a first through hole, wherein the column protrudes from the inner surface toward inside of the housing. The buckle assembly includes a fixing element, a shaft and a pair of retaining rings. The fixing element is assembled in the first through hole. The shaft is fixed in the housing. The retaining rings are pivoted to the shaft. Each of the retaining rings has an arc portion, and the retaining rings buckle each other and abut on the column. The arc portions are co-constructed to form a first hole communicating with the first through hole while the retaining rings buckle each other, and the fixing element is inserted in the first hole and column to be fixed in the housing.

12 Claims, 4 Drawing Sheets

(56) References Cited

U.S. PATENT DOCUMENTS

| | | | |
|---|---|---|---|
| 2013/0212865 A1* | 8/2013 | Herve | F16B 37/044 |
| | | | 156/92 |
| 2013/0266394 A1* | 10/2013 | Reznar | F16B 33/002 |
| | | | 411/122 |
| 2015/0192168 A1* | 7/2015 | Chen | F16B 41/002 |
| | | | 411/511 |
| 2015/0252835 A1* | 9/2015 | Daehler | F16B 39/04 |
| | | | 411/136 |
| 2016/0217943 A1* | 7/2016 | Kim | H01H 13/063 |
| 2019/0022764 A1* | 1/2019 | Hecht | B23B 27/1614 |
| 2019/0218830 A1* | 7/2019 | Toran Poggio | E05B 77/44 |
| 2020/0173486 A1* | 6/2020 | Tulloch | F16B 39/101 |

* cited by examiner

BUCKLE ASSEMBLY AND ELECTRONIC DEVICE USING THE SAME

CROSS-REFERENCE TO RELATED APPLICATION

This application claims the priority benefit of Taiwan application serial no. 109106892, filed on Mar. 3, 2020. The entirety of the above-mentioned patent application is hereby incorporated by reference herein and made a part of this specification.

BACKGROUND

Technical Field

The present invention relates to a component and a device, and particularly relates to a buckle assembly and an electronic device using the buckle assembly.

Description of Related Art

Notebook computers are usually set as standard configuration to meet the needs of customer replaceable units (CRU), so end users can assemble or disassemble a lower lid of the system side according to their needs with only general knowledge of mechanical disassembly.

Usually in conventional designs, a screw is used on the lower lid with a metal E-retaining ring to buckle the E-retaining ring into the non-thread zone of the screw to fix the lower lid.

However, the use of metal E-retaining rings actually has the following three risk of falling off:

1. Since the opening of the E-retaining ring interferes with the screw, the E-retaining ring may deform when the operator engages the E-retaining ring with the screw, which cause the E-retaining ring fall off after the screw is unlocked;

2. There is a chance that the screw may fall off after the screw is unlocked if a thickness of the E-retaining ring is the same as or smaller than the width of the thread of the screw. The problem is not completely avoided even if increasing the thickness of the E-retaining ring.

3. Some models need the screw to be electrically grounded, and there will be a layer of conductive fiber floating between the screw and the E-retaining ring as a medium. The conductive fiber may be rolled into a gap between the screw and the E-retaining ring when the screw is unlocked, which causes the inner diameter of the E-retaining ring to be stretched and fall off.

The above three conditions may cause the E-retaining ring to fall into the circuit board in the electronic device and cause a short circuit, which will burn the circuit board.

SUMMARY

The present disclosure provides a buckle assembly that prevents parts from falling off and falling into an electronic device, causing a short circuit on the circuit board.

The present disclosure provides an electronic device with an extending service life while meeting the needs of customers for replaceable parts.

A buckle assembly of the present disclosure is suitable for being assembled in a housing is provided. The housing has an inner surface and a column with a first through hole, wherein the column protrudes from the inner surface toward inside of the housing. The buckle assembly includes a fixing element, a shaft and a pair of retaining rings. The fixing element is assembled in the first through hole. The shaft is fixed in the housing. The retaining rings are pivoted in the shaft. Each of the retaining rings has an arc portion, and the retaining rings buckle each other and abut on the column. The arc portions are co-constructed to form a first hole communicating with the first through hole while the retaining rings buckle each other, and the fixing element is inserted in the first hole and column to be fixed in the housing.

An electronic device of the present disclosure having the above-mentioned housing is provided, and the above-mentioned buckle assembly is applied in the electronic device.

In one embodiment of the present invention, wherein when the fixing element is assembled to the first through hole along an assembling direction, the assembling direction is perpendicular to an axial direction of the shaft.

In one embodiment of the present invention, wherein one of the pair of retaining rings has a rib, and the other one of the pair of retaining rings has a notch, and the rib is conformal to the notch, so that the retaining rings buckle together in a direction parallel to the axial direction.

In one embodiment of the present invention, wherein the fixing element is a screw.

In one embodiment of the present invention, wherein the screw comprises a screw head, a non-thread zone, and a thread zone, and the non-thread zone is located between the screw head and the thread zone.

In one embodiment of the present invention, wherein the thread zone is located inside of the housing, and the pair of retaining rings buckles in the non-thread zone.

Based on the above, the buckle assembly of the present disclosure and the electronic device using the buckle assembly can prevent parts from falling off and falling into the electronic device, causing the circuit board to be short-circuited and burned.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
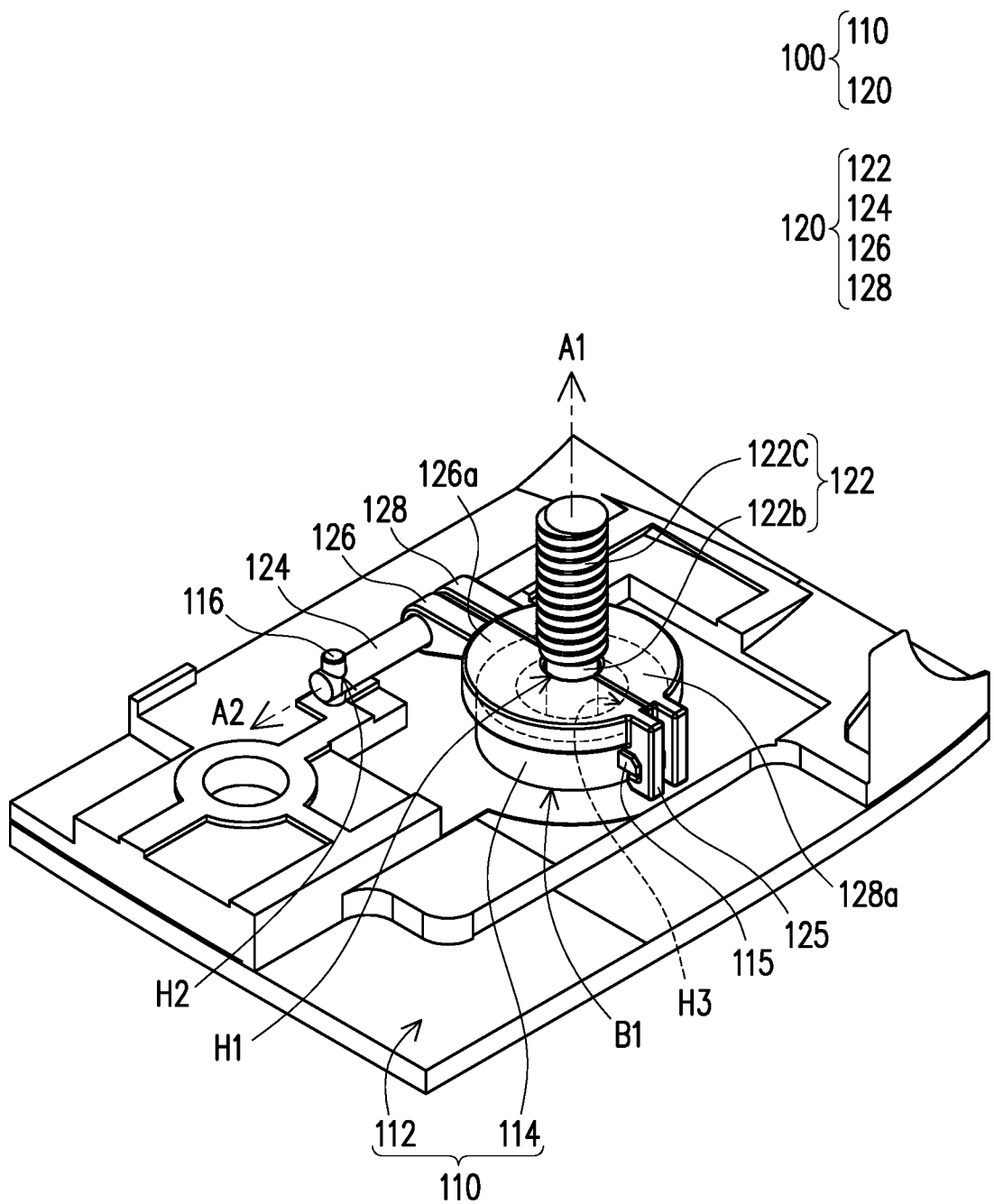
FIG. 1 is a partial schematic diagram of an electronic device according to an embodiment of the present invention.
Figure 2:
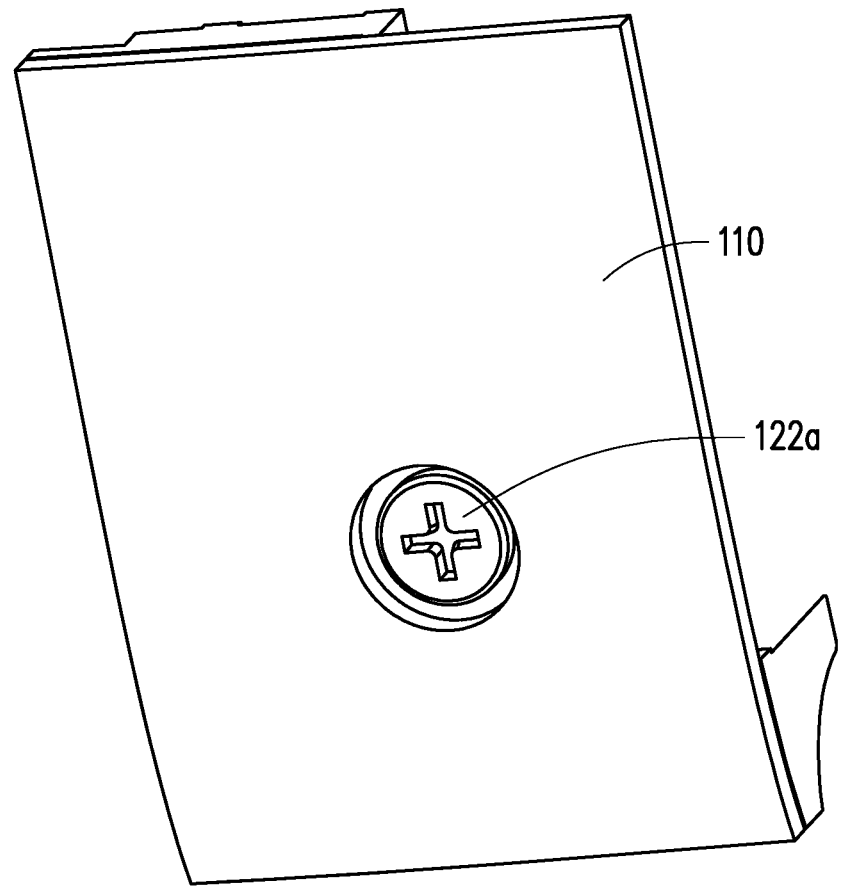
FIG. 2 is a schematic diagram of the electronic device of FIG. 1 from a different view angle.
Figure 3:
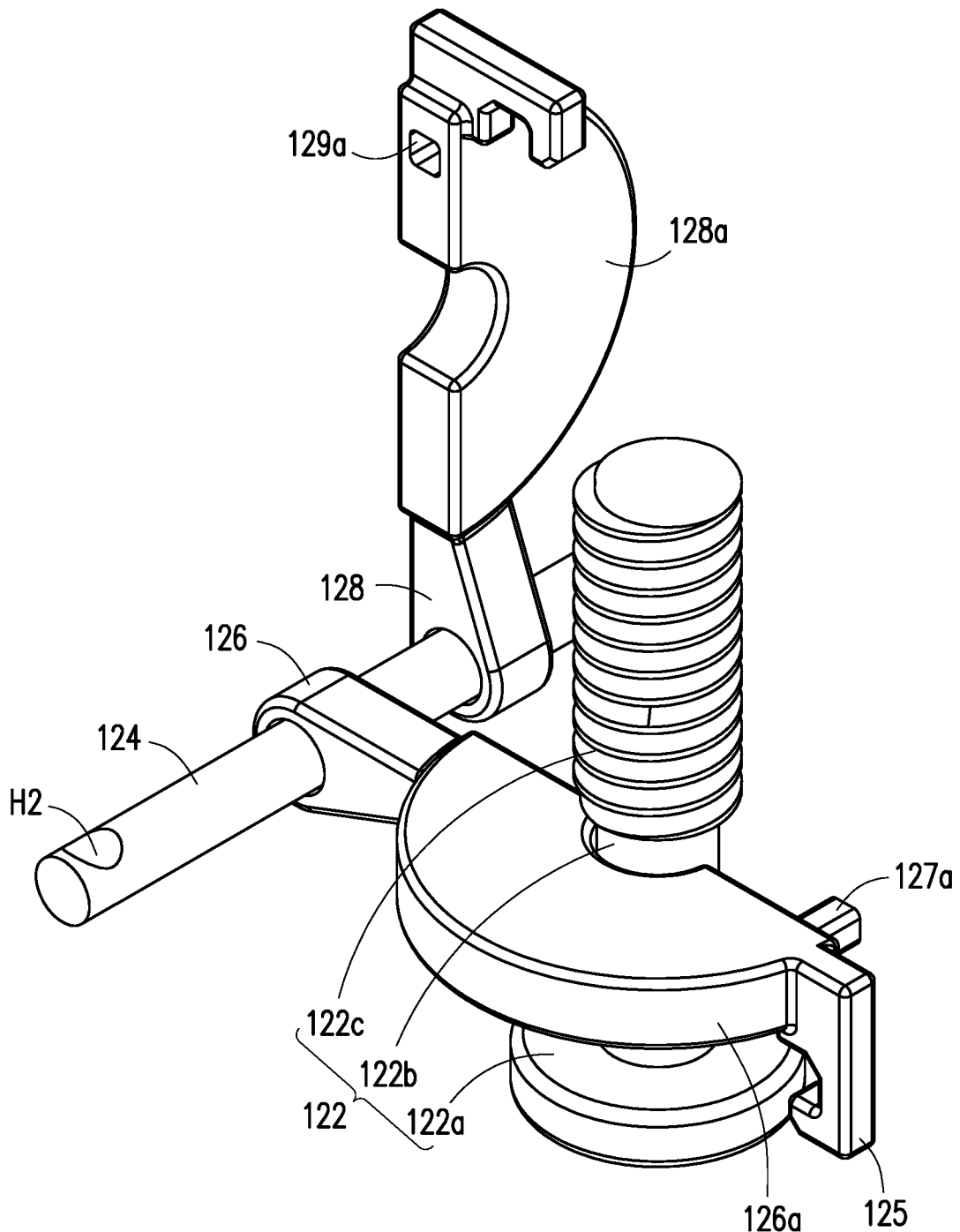
FIG. 3 is a schematic diagram of the retaining rings of the buckle assembly assembled to the shaft.

FIG. 1 is a partial schematic diagram of an electronic device according to an embodiment of the present invention, FIG. 2 is a schematic diagram of the electronic device of FIG. 1 from a different view angle, and FIG. 3 is a schematic diagram of the retaining rings of the buckle assembly assembled to the shaft. Please refer to FIG. 1, FIG. 2 and FIG. 3 at the same time, the electronic device 100 of this embodiment is a notebook computer, which includes a housing 110 and a buckle assembly 120.

The housing 110 is the lower cover of the electronic device 100, which has an inner surface 112 and a column B1, wherein the column B1 has a side wall 114 and a first through hole H3, and the column B1 protrudes from the inner surface 112 toward inside of the housing 110.

The buckle assembly 120 includes a fixing element 122, a shaft 124 and a pair of retaining rings 126, 128.

The fixing element 122 is used to assemble in the first through hole H3 of the column B1. The fixing element 122 is a screw, and the screw penetrates into the first through hole H3. The screw includes a screw head 122a, a non-thread zone 122b and a thread zone 122c, and the non-thread zone 122b is located between the screw head 122a and the thread zone 122c.

The shaft 124 is fixed in housing 110, and the shaft 124 has an axial direction A2. In this embodiment, the shaft 124 is fixed on the housing 110 by means of post-processing (such as hot melt). When the fixing element 122 is assembled in the first through hole H3, the assembling direction A1 is parallel to the direction in which the fixing element 122 is assembled in the first through hole H3, and the axial direction A2 of the shaft 124 is perpendicular to the assembling direction A1.

The retaining rings 126, 128 are pivoted to shaft 124 to be rotatable about the shaft 124. In addition, the retaining rings 126, 128 further move relatively away from or close to each other along the axial direction A2 of the shaft 124. The retaining ring 126 has an arc portion 126a while the retaining ring 128 has an arc portion 128a. A first hole H1 communicating with the first through hole H3 is co-constructed by the arc portions 126a, 128a when the retaining rings 126, 128 buckle each other and abut on the column B1.

In accordance with the above, the retaining rings 126, 128 have a buckling structure that allows the two arc portions 126a, 128a to be buckled together. The buckle structure is a mutually conformal structure. The wording "conformal" means that shapes of two structures are complementary, and one structure is inserted into the other structure fitly so that the two structures can be joined together. In this embodiment, the buckling structure is formed at the end of the arc portions 126a, 128a relatively far away from the shaft 124. One of the buckling structures is a rib 127a, and the other buckling structure is a notch 129a, and two arc portions 126a, 128a of the retaining rings 126, 128 are buckle together in a direction parallel to the axial direction A2. The buckling structure mentioned here is not limited to the combination of the rib 127a and the notch 129a disclosed in the present invention, people those skilled in the art may change the shape of the buckling structure according to requirements.

Incidentally, a convex strip 115 is provided on the side wall 114, and each of the ends of the two arc portions 126a, 128a relatively far away from the shaft 124 has a hook 125 extending toward the housing 110.

When assembling this buckle assembly 120, firstly assemble the two retaining rings 126, 128 to the shaft 124 in such a way that the two arc portions 126a, 128a co-constructing the first hole H1.

Next, fix both ends of shaft 124 to the inner surface 112 of the housing 110 by melting. Specifically, two second through holes H2 are provided at the two ends of the shaft 124, and the inner surface 112 of the housing 110 is provided with a pair of protrusions 116. The shaft 124 is fixed onto the housing 110 by inserting the protrusions 116 into the second through holes H2 and then thermally melting a portion of the protrusions 116 protruded from the second perforation H2.

Next, the fixing element 122 embodied as a screw is screwed into the first through hole H3 of column B1 from outside of housing 110. Since a diameter of the screw head 122a is larger than a diameter of the first through hole H3 of column B1 while the an outer diameters of the non-thread zone 122b and an outer diameters of the thread zone 122c are both smaller than an inner diameter of the first through hole H3 of the column B1, the screw head 122a will be retained outside of the housing 110 while the non-thread zone 122b and the thread zone 122c pass through the column B1 and are located inside the housing 110. Incidentally, the length of the non-thread zone 122b is greater than the thickness of the housing 110, so that a part of the non-thread zone 122b is exposed outside of the column B1.

Figure 4:
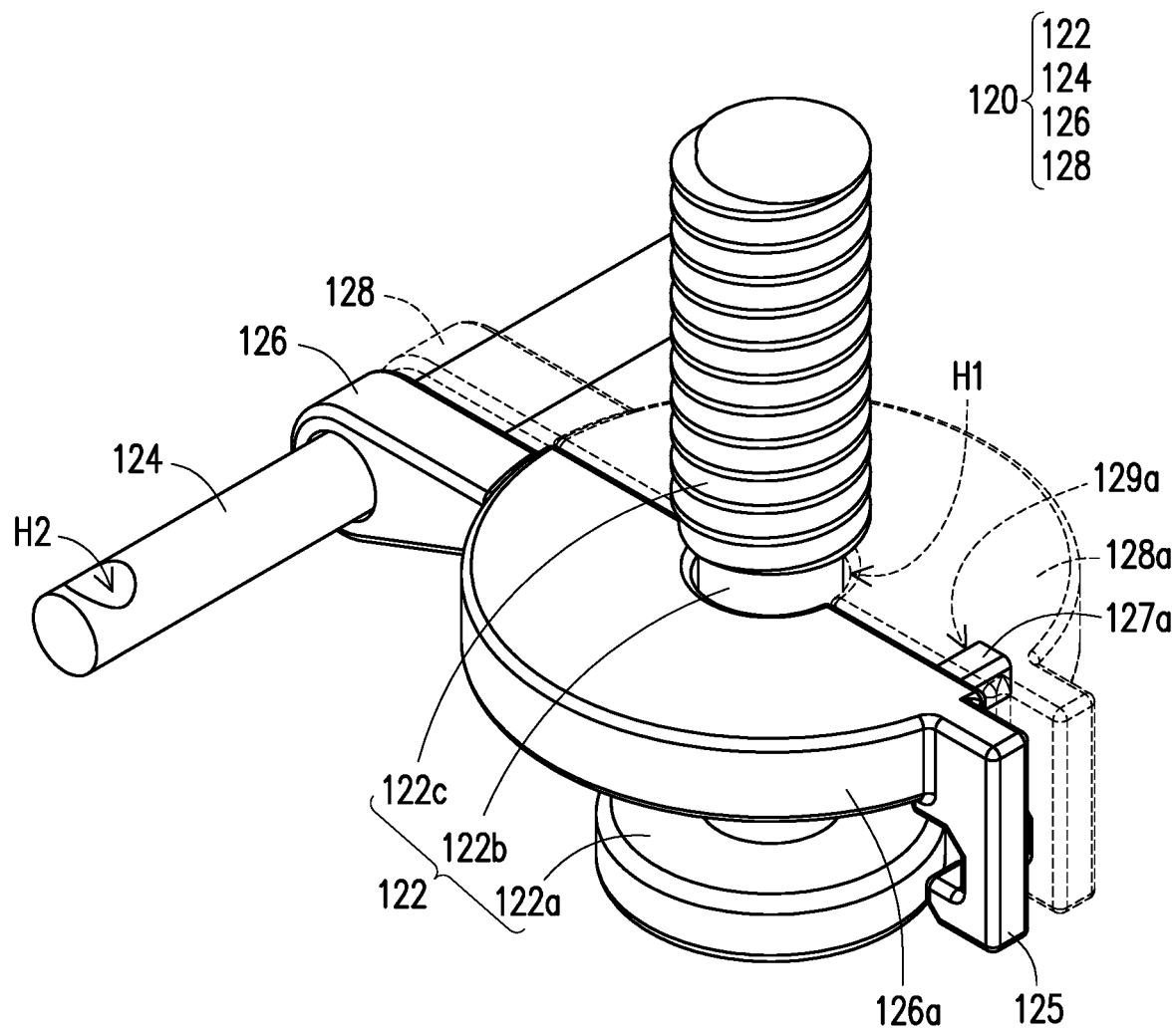
FIG. 4 is a schematic diagram when the buckle assembly is buckled.

FIG. 4 is a schematic diagram when the buckle assembly is buckled. Please refer to FIG. 3 and FIG. 4 at the same time. After then, using the shaft 124 as a rotating axis, the retaining rings 126 and 128 move close to each other along the axial direction A2 to buckle together by the insertion of the rib 127a and notch 129a. At the same time, the retaining rings 126 and 128 are buckled into the non-thread zone 122b and abut onto the column B1, wherein a first hole H1 communicating with the first through hole H3 of the column B1 is co-constructed by the two arc portions 126a, 128a. The retaining rings 126, 128 fix the fixing element 122 to the housing 110 by inserting the fixing element 122 into the first hole H1 and the first through hole H3 of the column B1.

Incidentally, when the two retaining rings 126 and 128 are buckle together, the hooks 125 provided at the ends of the two arc portions 126a and 128a will be hooked with the convex strip 115 on the side wall 114 to make the retaining rings 126 and 128 fixed to the side wall 114 of the column B1.

It should be noted that although the arc portions 126a and 128a shown in FIG. 1, FIG. 3 and FIG. 4 are semicircular, they are not limited to this, as long as the fixing element 122 can be fixed. When the user unlocks the fixing element 122 from the housing 110, since the retaining rings 126 and 128 are assembled on the shaft 124, the retaining rings 126 and 128 will not fall into the housing 110, and therefore short-circuit problems on the circuit board in the electronic device 100 is prevented.

In summary, the buckle assembly of the present invention is pivoted on the shaft through retaining rings, so the retaining rings used to fix the fixing element from falling into the electronic device after the fixing element is unlocked, causing the circuit board to be short-circuited and burned, is prevented. Therefore, the service life of the electronic device using this buckle assembly will be prolonged without affecting a convenient replacement of internal components to users.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A buckle assembly suitable for being assembled in a housing, and the housing has an inner surface and a column with a first through hole, wherein the column protrudes from the inner surface toward inside of the housing, and the buckle assembly comprising:
   a fixing element, assembled to the first through hole correspondingly;
   a shaft, fixed in the housing; and a pair of retaining rings, pivoted to the shaft, wherein each of the retaining rings has an arc portion, the retaining rings buckle each other and abut on the column, a first hole communicating with the first through hole is co-constructed by the arc portions while the retaining rings buckle each other, and the fixing element is inserted in the first hole and the column to be fixed in the housing.

2. The buckle assembly according to claim 1, wherein when the fixing element is assembled to the first through hole along an assembling direction, the assembling direction is perpendicular to an axial direction of the shaft.

3. The buckle assembly according to claim 2, wherein one of the pair of retaining rings has a rib, and the other one of the pair of retaining rings has a notch conformal to the rib, the retaining rings buckle together in a direction parallel to the axial direction.

4. The buckle assembly according to claim 1, wherein the fixing element is a screw.

5. The buckle assembly according to claim 4, wherein the screw has a screw head, a non-thread zone, and a thread zone, and the non-thread zone is located between the screw head and the thread zone.

6. The buckle assembly according to claim 5, wherein the thread zone is located inside the housing, and the pair of retaining rings buckles in the non-thread zone.

7. An electronic device, comprising:
  a housing, having an inner surface and a column with a first through hole, wherein the column protrudes from the inner surface toward inside of the housing;
  a buckle assembly, assembled to the housing, the buckle assembly comprising:
    a fixing element, assembled to the first through hole correspondingly;
    a shaft, fixed in the housing; and
    a pair of retaining rings, pivoted to the shaft, wherein each of the retaining rings has an arc portion, the retaining rings buckle each other and abut on the column, a first through hole communicating with the first through hole is co-constructed by the arc portions while the retaining rings buckle each other, and the fixing element is inserted in the first hole and the column to be fixed in the housing.

8. The electronic device according to claim 7, wherein when the fixing element is assembled to the first through hole along an assembling direction, the assembling direction is perpendicular to an axial direction of the shaft.

9. The electronic device according to claim 8, wherein one of the pair of retaining rings has a rib, and the other one of the pair of retaining rings has a notch conformal to the rib, and the retaining rings buckle together in a direction parallel to the axial direction.

10. The electronic device according to claim 7, wherein the fixing element is a screw.

11. The electronic device according to claim 10, wherein the screw comprises a screw head, a non-thread zone, and a thread zone, and the non-thread zone is located between the screw head and the thread zone.

12. The electronic device according to claim 11, wherein the thread zone is located inside of the housing, and the pair of retaining rings buckles in the non-thread zone.

* * * * *